(12) United States Patent
Buchine et al.

(10) Patent No.: US 8,734,659 B2
(45) Date of Patent: *May 27, 2014

(54) PROCESS FOR STRUCTURING SILICON

(75) Inventors: Brent A. Buchine, Watertown, MA (US); Faris Modawar, Georgetown, TX (US); Marcie R. Black, Lincoln, MA (US)

(73) Assignee: Bandgap Engineering Inc., Waltham, MA (US)

( * ) Notice: Subject to any disclaimer, the term of this patent is extended or adjusted under 35 U.S.C. 154(b) by 548 days.

This patent is subject to a terminal disclaimer.

(21) Appl. No.: 12/576,490

(22) Filed: Oct. 9, 2009

(65) Prior Publication Data

US 2010/0092888 A1 Apr. 15, 2010

Related U.S. Application Data

(60) Provisional application No. 61/195,872, filed on Oct. 9, 2008, provisional application No. 61/142,608, filed on Jan. 5, 2009.

(51) Int. Cl.
*B29D 11/00* (2006.01)
*B44C 1/22* (2006.01)

(52) U.S. Cl.
USPC ............ 216/24; 216/17; 216/40; 216/49; 216/95; 216/99; 438/745; 438/753

(58) Field of Classification Search
USPC .......... 216/17, 24, 40, 49, 95, 99; 977/762
See application file for complete search history.

(56) References Cited

U.S. PATENT DOCUMENTS

| 4,497,683 | A | | 2/1985 | Celler et al. |
|---|---|---|---|---|
| 4,606,931 | A | * | 8/1986 | Olsen et al. ............... 216/40 |
| 6,063,695 | A | * | 5/2000 | Lin et al. ............... 438/462 |
| 6,084,175 | A | | 7/2000 | Perry et al. |
| 6,479,072 | B1 | | 11/2002 | Morgan et al. |
| 2004/0164316 | A1 | * | 8/2004 | Nakashima et al. ........ 257/107 |
| 2004/0218858 | A1 | | 11/2004 | Guy |
| 2005/0110145 | A1 | | 5/2005 | Elers |
| 2005/0200020 | A1 | * | 9/2005 | Kamins .................. 257/756 |
| 2006/0207647 | A1 | * | 9/2006 | Tsakalakos et al. ........ 136/256 |
| 2006/0281212 | A1 | * | 12/2006 | Moriceau et al. ........... 438/48 |

(Continued)

OTHER PUBLICATIONS

Li et al (Metal-assisted chemical etching in HF/H2O2 produces porous silicon, Applied Physics Letters vol. 77, No. 16; p. 2572-2574; Oct. 16, 2000).*

(Continued)

*Primary Examiner* — Shamim Ahmed
(74) *Attorney, Agent, or Firm* — Wilmer Cutler Pickering Hale and Dorr LLP

(57) ABSTRACT

A process for etching a silicon-containing substrate to form structures is provided. In the process, a metal is deposited and patterned onto a silicon-containing substrate (commonly one with a resistivity above 1-10 ohm-cm) in such a way that the metal is present and touches silicon where etching is desired and is blocked from touching silicon or not present elsewhere. The metallized substrate is submerged into an etchant aqueous solution comprising about 4 to about 49 weight percent HF and an oxidizing agent such as about 0.5 to about 30 weight percent $H_2O_2$, thus producing a metallized substrate with one or more trenches. A second silicon etch is optionally employed to remove nanowires inside the one or more trenches.

30 Claims, 4 Drawing Sheets

(56) References Cited

U.S. PATENT DOCUMENTS

| | | | |
|---|---|---|---|
| 2007/0278476 A1 | 12/2007 | Black | |
| 2008/0003779 A1* | 1/2008 | Sawyer | 438/459 |
| 2008/0176345 A1* | 7/2008 | Yu et al. | 438/17 |
| 2008/0176395 A1* | 7/2008 | Cunningham | 438/627 |
| 2009/0256134 A1* | 10/2009 | Buchine et al. | 257/9 |
| 2010/0296340 A1* | 11/2010 | Basco et al. | 365/185.18 |

OTHER PUBLICATIONS

Huang et al, "Fabrication of Silicon Nanowire Arrays with Controlled Diameter, Length, and Density," Adv. Mater, 2007, 19, pp. 744-748.

Peng et al., "Aliigned Single-Crystalline Si Nanowire Arrays for Photovoltaic Applications," Small, 2005, 1, No. 11, pp. 102-1067.

Peng et al., "Fabrication of Large-Area Silicon Nanowire p-n Junction Diode Arrays," Adv. Mater., Jan. 2004, 16, No. 1, pp. 73-76.

Peng et al., "Fabrication of Single-Crystalline Silicon Nanowires by Scratching a Silicon Surface with Catalytic Metal Particles," Adv. Funct. Mater., 2006, 16, pp. 387-394.

U.S. Appl. No. 61/042,124 entitled "Designing the Host of Nano-Structured Optoelectronic Devices to Improve Performance," as filed with the United States Patent and Trademark Office on Apr. 3, 2008. 22 pages.

U.S. Appl. No. 61/195,872 entitled "Process for Structuring Silicon," as filed with the United States Patent and Trademark Office on Oct. 9, 2008. 18 pages.

Andrew R. Siekkinen et al., "Rapid synthesis of small silver nanocubes by mediating polyol reduction with a trace amount of sodium sulfide or sodium hydrosulfide," Chemical Physics Letters 432 (2006) 491-496.

International Search Report, PCT/US09/05544.

Written Opinion of the International Searching Authority, PCT/US09/05544.

\* cited by examiner

PROCESS FOR STRUCTURING SILICON

CROSS-REFERENCE TO RELATED APPLICATIONS

Priority is claimed to U.S. Provisional Patent Applications Nos. 61/195,872, filed Oct. 9, 2008, and 61/142,608, filed Jan. 5, 2009. These applications are incorporated by reference herein.

BACKGROUND OF THE INVENTION

The ability to structure and pattern silicon is important for many applications. Many devices require bulk micromachining, which defines structures by selectively etching deep inside the substrate. The process is enabled by modern photolithography in combination with tools and techniques that have been developed specifically for deep etching into silicon. Relevant information regarding silicon fabrication processes known to those of skill in the art can be found, for example, in Sami Franssila, *Introduction to Microfabrication* (John Wiley & Sons, 2004), and the references cited there.

Some of the bulk micromachining processes known in the art are dry and some are wet. For example, reactive ion etching (RIE) and inductively coupled plasma (ICP) are two dry techniques that utilize a combination of reactive ions and kinetically charged species to "mill" into a material and define high aspect ratio features. For all these methods, the depth of the trenches is limited by the slight taper in the sidewalls after the etch. The slight taper causes the trench to get narrower as the silicon wafer is etched deeper. The taper limits the resulting aspect ratio (which is the ratio of the maximum depth to the trench width), and effectively either limits the depth of the features or the minimum feature size. For deep RIE processes, the aspect ratios can be slightly better than 20:1.

Much attention has been devoted to optimizing and reducing the slight taper in RIE processes. Companies have developed methods for operating these tools in specific ways to decrease the taper, increase the aspect ratio, and ease the tradeoff between the maximum obtainable depth and minimum feature size; for example the Bosch process used by Oxford. These processes do improve the aspect ratio, however designers are still limited by the aspect ratio. In addition, most of the processes to improve the aspect ratio also result in rough sidewalls, which is non-ideal for many applications. Furthermore, RIE is expensive, low throughput, and requires a high vacuum to operate.

Wet processing is also used to etch high aspect ratio features into silicon. Potassium hydroxide (KOH) and tetramethylammonium hydroxide (TMAH) are two chemicals typically utilized in an aqueous environment to etch and structure silicon. This process takes advantage of the fact that silicon has a well-defined crystal structure and certain crystal planes are more susceptible to etching. The etch results in pits that have angled walls, with the angle being a function of the crystal orientation of the substrate. This technique does not require high vacuum systems thus it is less expensive than the dry processing techniques described above. However, the crystal-dependent nature of the process requires additional consideration for wafer orientation and device design making processing less straightforward. In addition, although these wet etches are highly anisotropic and have a preferred etch direction, they still do etch in the non-preferred directions. Thus, although these processes obtain high aspect ratio features, they are also limited by the sidewall taper. In general wet techniques have a larger aspect ratio and smoother sidewalls than dry techniques, but require fine alignment of the features with the crystallographic orientation of the wafer. In addition, since these techniques are limited to the specific crystallographic directions, only rectangles and lines (and not arbitrary shapes in the x-y plane) can be patterned using this technique.

There is thus a need for a process which allows etching of silicon at high aspect ratios but which improves on existing processes such as reactive ion etching.

SUMMARY OF THE INVENTION

A process for etching a silicon-containing substrate to form structures is provided. In the process, a metal is deposited and patterned onto a silicon-containing substrate (commonly one with a resistivity above 1-10 ohm-cm) in such a way that the metal is present and touches silicon where etching is desired and is blocked from touching silicon or not present elsewhere. The metallized substrate is submerged into an etchant aqueous solution comprising about 4 to about 49 weight percent HF and an oxidizing agent such as about 0.5 to about 30 weight percent $H_2O_2$, thus producing a metallized substrate with one or more trenches. A second silicon etch is optionally employed to remove nanowires inside the one or more trenches.

DETAILED DESCRIPTION OF THE INVENTION

Figure 1:
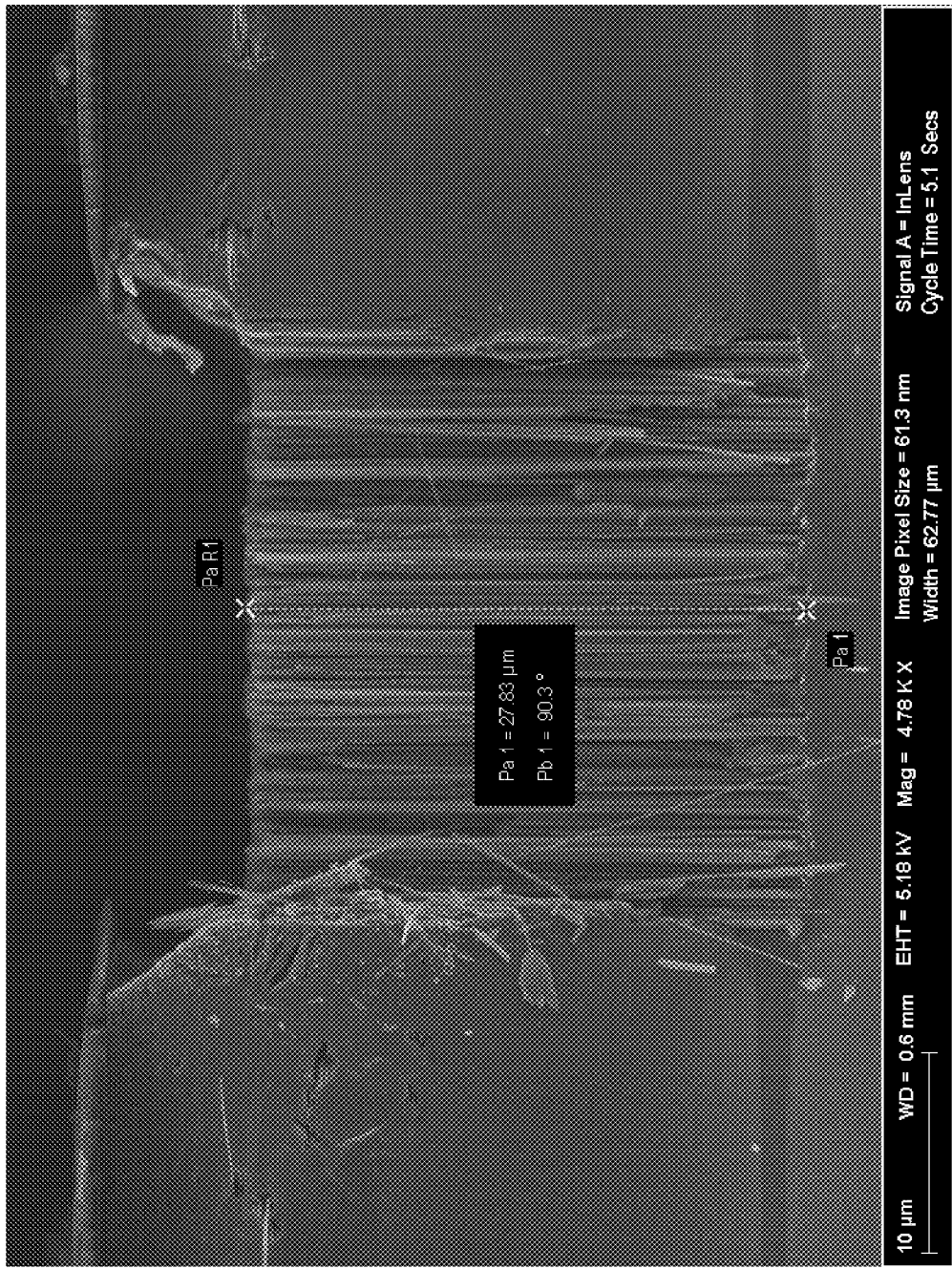
FIG. 1 depicts silicon etching carried out by a silver-enhanced etching in HF in a process of this invention.

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Where a range of values is provided, it is intended that each intervening value between the upper and lower limit of that range and any other stated or intervening value in that stated range is encompassed within the disclosure. For example, if a range of 1 µm to 8 µm is stated, it is intended that 2 µm, 3 µm, 4 µm, 5 µm, 6 µm, and 7 µm are also disclosed, as well as the range of values greater than or equal to 1 µm and the range of values less than or equal to 8 µm.

This patent application describes a method of etching into silicon and the structures obtained by this etching process. This method of etching into silicon can provide deep trenches, with little, if any, sidewall taper and minimal surface roughness. In addition, the technique, unlike other high aspect ratio silicon etch technologies, does not require expensive tools, a high vacuum, or processing conditions that are expensive to obtain.

This application discloses a new approach of etching deep features into silicon that incorporates the advantage of patterning arbitrary shapes in the x-y plane which are uniform in the z-direction obtained by dry processing such as RIE, as well as the advantages of the low cost, high throughput, high aspect ratios, and low surface roughness of solution based/ wet etching. This novel technique utilizes metal (for example silver) for etching silicon in a bath of hydrofluoric acid and hydrogen peroxide with a range of concentrations.

The invention described here builds on recent work demonstrated for the fabrication of silicon nanowires using a solution made up of a metal salt and a strong acid (typically $AgNO_3$ and HF). (See reference (a) below.) By controlling the concentrations of each component in solution, silicon can be etched normal to the plane of the wafer to form silicon nanowires. (See reference (b) below.) The mechanism by which etching occurs is not clearly understood. However the technique may be practiced using $H_2O_2$ in the chemical bath and utilizing Ag metal on top of arrays of silicon dioxide or iron oxide nanoparticles or polystyrene beads (see references (c) and (d) below). Ag initiates the etching reaction, so wherever a sufficiently thin (for example, less than about 30 nm or 50 nm) film of Ag is in contact with silicon, the silicon is etched. The silicon dioxide or iron oxide nanoparticles act as a barrier between the Ag and Si and thus the size of the nanoparticles define the nanowire diameter as the silicon is etched around the nanowire. This specific technique is limited in that only silicon nanowire arrays were fabricated.

In an aspect of this invention, techniques related to the prior art nanowire fabrication techniques are employed to produce structures other than nanowire arrays. Instead of using nanoparticles to define the nanowire dimensions, other techniques of determining where the Ag touches the silicon are employed. By extending the patterning process, features such as lines, squares, or any arbitrary 2-D shape can be defined on the silicon surface. Thus as long as there are regions where the metal and Si are in contact and regions where they are not in contact, an arbitrary shape that is uniform in the z-direction into the wafer can be etched into the silicon sample. Processes of this invention may add more control over the shape etched into the silicon compared to the nanowire array work which could only control the density, wire diameter, and wire length. In both the nanowire array work and this invention, the depth of the feature may be controlled by the sample etch time.

Unlike KOH wet etches, the resulting features are etched normal to the wafer plane regardless of the orientation and doping concentration of the silicon substrate. Thus device design does not need to consider crystallographic orientation. The zigzag pattern visible in sidewalls as a result of other etching processes is generally not observed here.

In an aspect of the invention, one employs as an etchant an aqueous solution comprising about 4 to about 49 weight percent HF and about 0.5 to about 30 weight percent $H_2O_2$. The concentration of HF can vary from full strength (49 wt %) to very nominal concentrations. The length of the resulting nanostructure may increase as HF concentration is reduced. The solution may comprise, for example, about 2 to about 25 weight percent HF, or about 4 to about 15 weight percent HF, or about 6 to about 12 weight percent HF. The solution may comprise, for example, about 0.5 to about 15 weight percent $H_2O_2$, about 1 to about 10 weight percent $H_2O_2$, or about 1 to about 5 weight percent $H_2O_2$, or about 1.25 to about 2 weight percent $H_2O_2$. In place of $H_2O_2$ other oxidizing agents may be employed, for example mineral acids such as nitric acid. An oxidizing agent (also called an oxidant or oxidizer) is a substance that readily transfers oxygen atoms or tends to gain electrons in a redox chemical reaction. One such oxidizer is pure oxygen, which may be introduced by bubbling oxygen through the HF. Other oxidizers include: ozone, chlorine, iodine, ammonium perchlorate, ammonium permanganate, barium peroxide, bromine, calcium chlorate, calcium hypochlorite, chlorine trifluoride, chromic acid, chromium trioxide (chromic anhydride), peroxides such as hydrogen peroxide, magnesium peroxide, dibenzoyl peroxide and sodium peroxide, dinitrogen trioxide, fluorine, perchloric acid, potassium bromate, potassium chlorate, potassium peroxide, propyl nitrate, sodium chlorate, sodium chlorite, and sodium perchlorate.

It may be desirable to use a less reactive alternative oxidizer used in place of $H_2O_2$. Comparative reactivity towards the metal deposited (e.g., silver), silicon, or silicon dioxide may be of interest in the selection of an oxidizer. Reactivity may be measured, for example, by the extent to which the reaction goes forward in a particular period of time, or by determining a reaction rate as discussed in books on physical chemistry and chemical kinetics. (See, e.g., Peter W. Atkins & Julio de Paula, *Atkins' Physical Chemistry* (8th ed. 2006), especially chapters 22 and 23.) Measurements may be made in conditions such as temperature and pressure similar to those of the etching process.

The minimum dimensions achievable by processes of the invention may be, for example, about 50 nm, about 100 nm, about 200 nm, or about 500 nm. A more precise patterning process for the metal and/or barrier may produce smaller minimum dimensions, but as is known to those of skill in the art, greater patterning precision often involves more costly processes.

The largest possible aspect ratio obtained by processes of the invention is very large. The aspect ratio may be, for example, at least about 40:1, about 60:1, about 80:1, about 100:1, or about 500:1. Etching of the silicon will normally commence only at the metal/Si interface resulting in a limited amount of undercut underneath the mask due to the lack of metal on the sidewalls of features during the etching process. Since Ag should be in physical contact with the silicon to effect etching and Ag is a solid, the size of the trench remains constant regardless of how deep the trench is etched. The etch rate of silicon wafer without silver in the $HF/H_2O_2$ is minimal. This etch rate compared to the metal enhanced etch rate is what normally determines the minimum taper, and thus the maximum aspect ratio obtained by this process. If a slight taper is desired, a higher HF concentration can be used. In this case as the etch progresses the HF may attack the metal, causing it to flake off and become smaller thus decreasing the size of the etched feature.

A barrier can be used to separate the metal from the silicon surface in parts of the wafer. The barrier can be defined by traditional lithographic processing in order to pattern a wide variety of geometrical shapes. The utilization of any patterning process (for example, soft-lithography including surface stamping, screen-printing, dip-pen, SAMs, e-beam, or FIB) is sufficient for defining the barrier or localizing the metal layer.

One possible method for practicing this invention involves the use of photolithography to pattern a surface of a silicon wafer with negative photosensitive resist.

A wide variety of barrier layers can be used other than a simple positive or negative photoresist. It is desirable to pick a barrier material that is non-reactive in the $HF/H_2O_2$ etching solution (photoresist, polymer, ceramic, organic, inorganic, metallic, non-metallic, in a solid, liquid or gas (air) phase). A bare silicon surface free of material can also be effective; however, since HF can etch silicon, although at a slow rate, the best results are commonly obtained when a barrier is used to isolate the metal from the Si. In addition, metal occasionally redeposits on free surfaces that can speed up the reaction locally and result in a non-uniform result or porous silicon. Thus, the barrier layer not only protects the silicon from the metal enhanced etching, but can also prevent the metal from dissolving in the solution and redepositing elsewhere on the wafer.

Metals other than Ag can also be used to initiate the reaction. For example, we have found that nickel, like silver, enhances the etch rate of silicon in the solution.

The metal layer can be deposited in a variety of ways: physical vapor deposition via sputtering, e-beam evaporation, or thermal evaporation; electrochemically in a bath; or a foil can be simply placed on the surface, much like in damascening. It is also possible to initiate specific reaction chemistries in order to create a metal (barrier) silicon interface. For example, FIB can be used to reduce an organometallic precursor into Ag wherever an ion beam reacts, or for example, metal-organic block co-polymers can be spin coated and reduced to metal.

Figure 3:
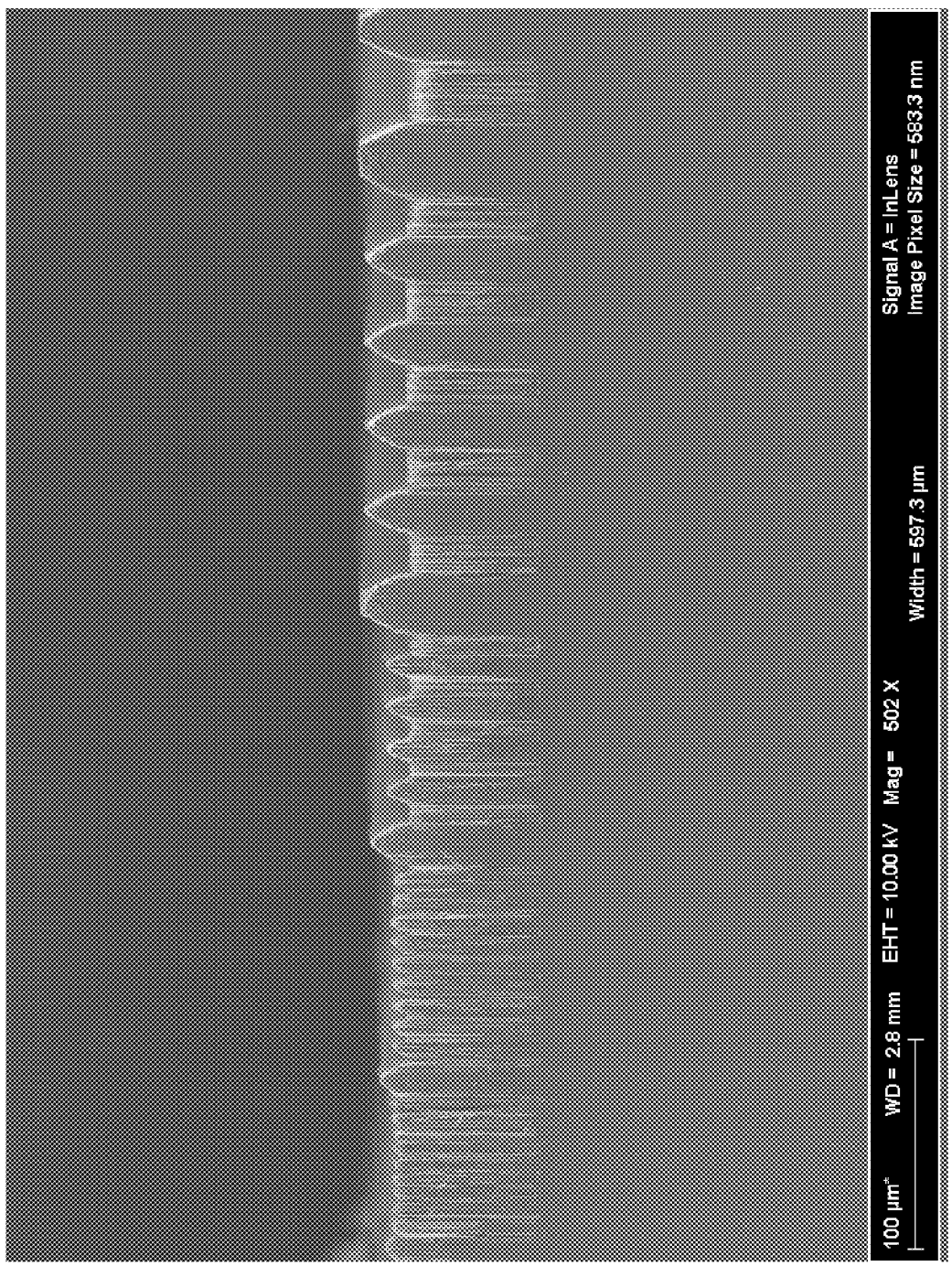
FIG. 3 depicts an example of patterning micron-sized devices with the silver-enhanced etching in HF technique.

Examples of the resulting structures are shown in FIGS. 1 and 3 and described in Example 1 below. Smooth sidewalls with large aspect ratios are observed. In the example shown, the maximum aspect ratio is around 1:27. Higher aspect ratios may be achieved by increasing the etch time.

Figure 2:
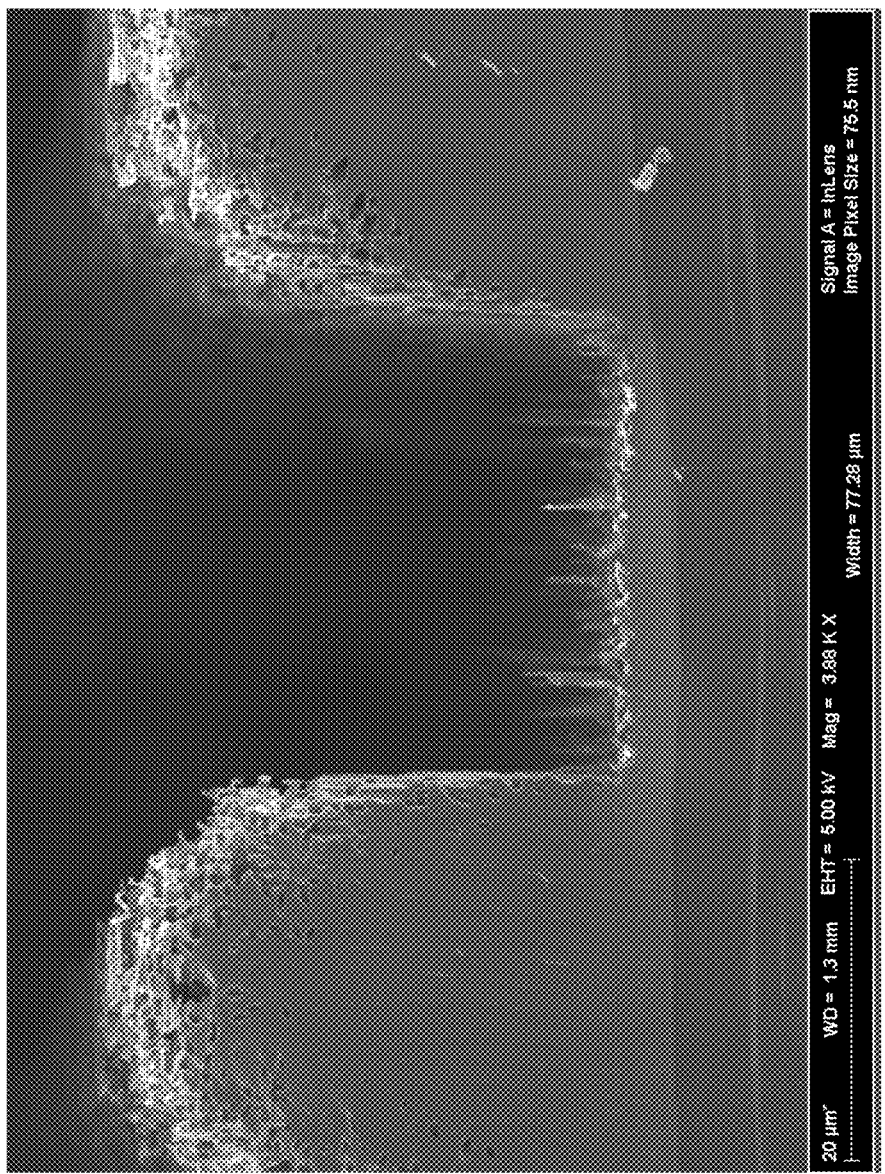
FIG. 2 depicts the sample in FIG. 1 after 3 minutes in 45% KOH heated to 50° C.

The method described results in undesired nanowires in regions where silver is touching the silicon. In some applications such as stamps, the nanowires are desirable. However, since many applications cannot tolerate the presence of such nanowires inside the trenches, an etch in (for example) 45% KOH at 50° C. may be used to remove the nanowires. The resulting structure is shown in FIG. 2.

Applications:

The ability of processes of the invention to etch deep features into a silicon wafer with high aspect ratios, smooth sidewalls, with a high throughput, and at low cost is useful for many applications including in micro electro mechanical systems (MEMs), optoelectronic, and electrochemical devices. Although the largest benefits of this process are for applications that require a high aspect ratio deep etching in silicon, the low cost and the smooth sidewalls would also benefit areas which have less stringent requirements for taper.

The most apparent application of this technology is MEMs, where the aspect ratio limits the device design. One type of MEMs work that requires deep etches and smooth sidewalls is RF MEMs. Bulk micromachining of capacitively or piezoelectrically actuated beams, etched and released from either silicon on insulator (SOI) or bulk silicon wafers preferably employ near ideal geometries with vertical sidewalls and minimal surface roughness. Some examples of RF MEMs devices that would benefit from the processes disclosed here are phase shifters and resonators. The resonant behavior of these devices depends directly on geometry. Slight inconsistencies in the result can cause a dramatic shift in performance. Hence, sidewall roughness is important and has been also attributed to non-ideal behavior in these devices. Since the etch described in this application results in smooth sidewalls with deep etches, RF MEMs made by this process are likely to be more predictable and have closer to ideal behavior.

The processes disclosed here can also be used to fabricate micro-fluidic channels in micro-fluidic devices. The field of micro fluidics exploits fluid behavior at the microscale that differs from the macroscale. Turbulent flow begins to display characteristics more similar to a laminar flow and interesting properties like energy dissipation, surface tension and fluidic resistance begin to dominate fluid behavior. Micro-fluidics has been key in the development of inkjet print heads, lab-on-a-chip technology, micro-propulsion, and acoustic droplet ejection and has even shown promise in the development of fuel cells and drug delivery systems. Sidewall roughness can drastically alter the flow behavior of micro fluidic channels and thus micro fluidics might benefit from using the metal enhanced silicon etching described in this provisional application.

The field of wave-guides and photonic crystals is another area where geometry and roughness are a major challenge. Photonic crystals are made up of periodic materials with varying dielectric constants in an effort to affect the propagation of electromagnetic waves much the same way that semiconductors affect the propagation of electrons. One of the key difficulties is ensuring that the structure has sufficient precision with regards to geometry and that the surfaces are atomically smooth. This leads to very sharp index of refraction contrasts in the material and prevents scattering losses. Thus photonic bandgap materials require both good control of processing with smooth interfaces and scalable techniques that can be mass-produced. Hence, photonic bandgap devices can benefit from the manufacturing methods described here.

This technique can also be used as a process in the manufacture of accelerometers, gyroscopes, mass-flow sensors, pressure sensors, optical switches, optical displays, micro relays, read-write heads, and RF components for cell phones, radar and satellite communication.

In addition to the situation where the inventive process can contribute to better device performance, the low cost nature of the process would also be beneficial in areas which have less stringent requirements for side-wall roughness and taper.

The following references are of interest in relation to this application: (a) K. Peng, Z. Huang, J. Zhu, *Advanced Materials*, 16, 73-76, "Fabrication of Large-Area Silicon Nanowire p-n Junction Diode Arrays." (b) K. Peng, J. Hu, Y. Yan, Y. Wu, H. Fang, Y. Xu, S. Lee, and J. Zhu, *Advanced Functional Materials*, 16, 387-394, "Fabrication of Single-Crystalline Silicon Nanowires by Scratching a Silicon Surface With Catalytic Metal Particles." (c) U.S. Provisional Patent Application No. 61/042,124. (d) Z. Huang, H. Fang, J. Zhu, *Advanced Materials*, 19, 744-748 (2007), "Fabrication of Silicon Nanowire Arrays with Controlled Diameter, Length, and Density". (e) United States Published Patent Application No. 20070278476; (f) U.S. Provisional Patent Application Ser. No. 61/195,872, filed Oct. 9, 2008.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The following examples are put forth so as to provide those of ordinary skill in the art with a complete disclosure and description of how to implement the invention, and are not intended to limit the scope of what the inventors regard as their invention. Efforts have been made to ensure accuracy with respect to numbers (e.g., amounts, temperature, etc.) but some errors and deviations should be accounted for.

Example 1

Positive 1813 Shipley photoresist was spun onto a clean 4" (100) silicon wafer using a 2-step coating procedure. First, the wafer was ramped to 500 RPM (100 RPM/sec) and held for 5 seconds in order to spread the resist evenly across the wafer surface. Next, the substrate was ramped to 4000 RPM (1000 RPM/sec) and held for 40 seconds in order to achieve a uniform resist thickness. The wafer was then soft-baked for 2 minutes at 115° C. on a hotplate and allowed to cool for 5 minutes at room temperature on a metal surface. Next, the resist was exposed on an MJB4 mask aligner at a dose of 60 mJ/cm$^2$ using a positive photomask. The open area in the mask consisted of lines with 2 micron, 5 micron, 10 micron and 20 micron line widths. After the exposure was complete, the pattern was developed using CD-30 developer by swirling for 40 sec. The wafer was subsequently rinsed with deionized water and dried with flowing $N_2$.

After the pattern was inspected for defects on an optical microscope, it was hard-baked on a hotplate at 150° C. for 10 minutes and subsequently diced into 1 cm² chips. A 40 nm thin film of silver was then deposited onto an individual chip via thermal evaporation. The chip was submerged into a solution consisting of 8 wt % HF and 1.5 wt % $H_2O_2$ solution for anywhere between 10-90 min. As a result, etching commenced normal to the surface of the silicon in regions where silver and silicon formed an interface; the final etch depth directly correlated with the length of time the chip spent in the bath. Regions protected by photoresist were thus prevented from being etched resulting in features seen in FIGS. 1 and 3. The chip was removed from the etching bath, rinsed with deionized water and blown dry with $N_2$. Next, the photoresist and silver was removed by soaking the chip in for a period of 15 minutes. In some cases longer times were required due to the excessive hard-baking of the resist. Any residual Ag that remained inside the trench was removed using a "silver etchant" supplied by Transene Corporation with an expected etch rate of 200 A/sec.

It can be seen from FIGS. 1 and 3 that a great deal of "grass" formed inside the trench during the etch process. In order to remove this, the sample was submerged into a bath of 45 wt % KOH at 50° C. for a period of 3 minutes. The final result can be seen in FIG. 2.

Example 2

A process similar to that of Example 1 is carried out. However, the solution into which the chip is submerged is a aqueous HF solution without $H_2O_2$. Before the chip is immersed, $O_2$ gas is flowed into the bath to create a vigorous bubbling for a period of 10 minutes. Once the bath is seasoned, the samples are submerged. At the completion of the etch, the samples are removed and put into a dump-tank of flowing DI water and blown dry with $N_2$. At this point the remaining Ag on the surface can be removed with a silver etchant, for example the etchant supplied by Transene Corporation.

Figure 4:
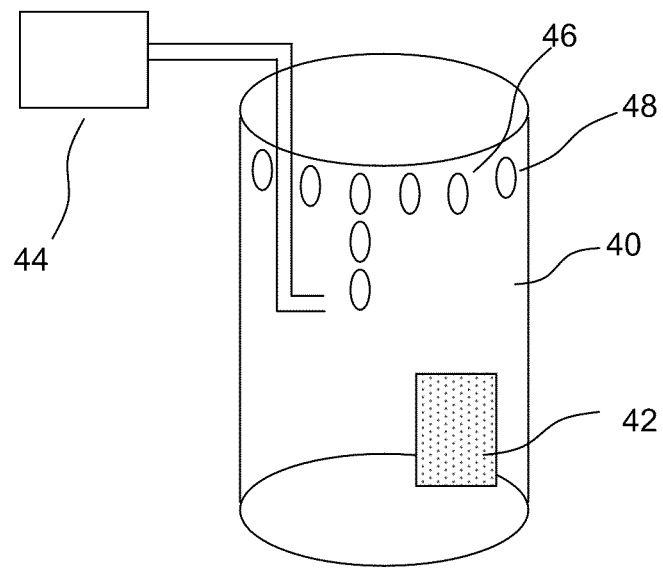
FIG. 4 depicts a setup for using bubbling oxygen as an oxidizing agent.

A setup for $O_2$ gas flow is depicted in FIG. 4. There is a container holding HF etchant 40. In the container there is a silver/silicon substrate 42. There is an oxygen source 44 which produces oxygen bubbles such as 46 and 48.

With the use of $O_2$ gas rather than $H_2O_2$, the formation of grass may be avoided.

Since the silicon etch rate is suppressed when grass is inside the trenches, processes such as those using $H_2O_2$ that result in grass tend to have smoother sidewalls. In addition, the more aggressive oxidizers in general etch faster than the less aggressive oxidizers such as $O_2$. Since the aspect ratios of the etched features are commonly limited by the ratio of the bare silicon etch rate to the metal enhanced etch rate, a decrease in the metal enhanced etch rate would be expected generally to decrease the maximum obtainable aspect ratio.

The invention claimed is:

1. A process for etching a silicon-containing substrate to form structures comprising the steps of: (a) depositing and patterning metal onto a silicon-containing substrate in such a way that the metal is present and touches silicon where etching is desired and is blocked from touching silicon or not present elsewhere, (b) submerging the metallized substrate into an etchant aqueous solution comprising about 4 to about 49 weight percent HF and an oxidizing agent, thus producing a metallized substrate with one or more trenches, wherein the trenches have an aspect ratio larger than about 80:1 and have smooth sidewalls, (c) optionally employing a second different silicon etch to remove nanowires inside the one or more trenches, wherein the patterning of metal takes place by using photolithography, surface stamping, screen-printing, or dip-pen techniques.

2. A process as described in claim 1, wherein the metal deposited and patterned in step (a) is silver.

3. A process as described in claim 2, wherein the silver is less than about 50 nm thick.

4. A process as described in claim 1, wherein a barrier between the metal and the silicon-containing substrate prevents the metal from touching the silicon in certain areas of the substrate.

5. A process as described in claim 4, wherein the barrier comprises an inorganic non-metallic material.

6. A process as described in claim 4, wherein the barrier comprises an organic material.

7. A process as described in claim 6, wherein the barrier comprises an organic material which is not an organometallic.

8. A process as described in claim 7, wherein the barrier comprises a photoresist.

9. A process as described in claim 6, wherein the organic material is organometallic.

10. A process as described in claim 1, wherein the substrate comprises an exposed silicon surface.

11. A process as described in claim 1, wherein step (b) comprises removing the metal on portions of the substrate where etching is not desired.

12. A process as described in claim 11, where the removal of metal is done by a lift-off technique.

13. A process as described in claim 1, wherein the deposition of the metal in step (b) comprises reduction of an organometallic precursor.

14. A process as described in claim 1, wherein a metal containing component is deposited onto the silicon which acts to increase the etch rate of silicon in the presence of the etchant.

15. A process as described in claim 1, wherein the silicon-containing substrate prior to deposition and patterning of the metal is a bulk silicon wafer.

16. A process as described in claim 1, wherein the silicon-containing substrate prior to deposition and patterning of the metal is a silicon-on-insulator wafer.

17. A process as described in claim 1, wherein the silicon-containing substrate prior to deposition and patterning of the metal comprises polysilicon film.

18. A process as described in claim 1, wherein the silicon-containing substrate prior to deposition and patterning of the metal comprises epitaxially grown silicon.

19. A process as described in claim 1, wherein the result of steps (a)-(b) and, if performed, (c) is further processed to produce black silicon.

20. A process as described in claim 1, wherein the result of steps (a)-(b) and, if performed, (c) is further processed to produce an optoelectronic device.

21. A process as described in claim 20, wherein the optoelectronic device is a light emitting diode.

22. A process as described in claim 1, wherein the result of steps (a)-(b) and, if performed, (c) is further processed to produce photonic elements and/or waveguides.

23. A process as described in claim 1, wherein the result of steps (a)-(b) and, if performed, (c) is further processed to produce electromechanical devices.

24. A process as described in claim 1, wherein the result of steps (a)-(b) and, if performed, (c) is further processed to produce electrochemical devices.

25. A process as described in claim 1, wherein the result of steps (a)-(b) and, if performed, (c) is further processed to produce a photovoltaic or a solar cell device.

26. A process as described in claim 1, wherein the pattern created by steps (a)-(b) and, if performed, (c) induces the creation of mixed electronic states in the patterned and etched silicon-containing substrate.

27. A process as described in claim 1, wherein the silicon-containing substrate prior to steps (a)-(b) and, if performed, (c) has mixed electronic states.

28. A process as described in claim 1, wherein the oxidizing agent is $H_2O_2$ with a concentration of about 0.5 to 30 weight percent.

29. A process as described in claim 1, wherein the oxidizing agent is $O_2$ bubbled through the etchant aqueous solution.

30. A process as described in claim 1, wherein the optional step (c) is carried out.

\* \* \* \* \*